US010812046B2

(12) United States Patent
Kaajakari (10) Patent No.: US 10,812,046 B2
(45) Date of Patent: Oct. 20, 2020

(54) MICROMECHANICAL RESONATOR HAVING REDUCED SIZE

(71) Applicant: Murata Manufacturing Co., Ltd., Nagaokakyo-shi, Kyoto-fu (JP)

(72) Inventor: Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 236 days.

(21) Appl. No.: 15/890,450

(22) Filed: Feb. 7, 2018

(65) Prior Publication Data

US 2019/0245513 A1 Aug. 8, 2019

(51) Int. Cl.
| H03H 9/00 | (2006.01) |
| H03H 9/24 | (2006.01) |
| H03H 9/02 | (2006.01) |
| H03H 9/10 | (2006.01) |
| G01C 19/5712 | (2012.01) |
| G04C 3/08 | (2006.01) |

(52) U.S. Cl.
CPC ...... *H03H 9/2452* (2013.01); *H03H 9/02338* (2013.01); *H03H 9/02362* (2013.01); *H03H 9/02433* (2013.01); *H03H 9/1057* (2013.01); *H03H 9/2489* (2013.01); *G01C 19/5712* (2013.01); *G04C 3/08* (2013.01); *H03H 9/2473* (2013.01); *H03H 2009/0244* (2013.01); *H03H 2009/02251* (2013.01)

(58) Field of Classification Search
CPC ............... H03H 9/2452; H03H 9/2489; H03H 9/02338; H03H 9/02362; H03H 9/1057; H03H 9/02433; H03H 9/2473; H03H 2009/02251; H03H 2009/0244; G04C 3/08; G01C 19/5712; H02N 1/00–12

USPC .................................................. 310/300, 309
See application file for complete search history.

(56) References Cited

U.S. PATENT DOCUMENTS

| 5,986,381 A | * | 11/1999 | Hoen ..................... H02N 1/004 |
| | | | 310/309 |
| 8,110,966 B2 | | 2/2012 | Iwai |
| 8,120,234 B2 | | 2/2012 | Iwai |
| 8,191,216 B2 | | 6/2012 | Yamazaki et al. |

(Continued)

FOREIGN PATENT DOCUMENTS

| JP | S54-58395 A | 5/1979 |
| JP | S56-85921 A | 7/1981 |

(Continued)

OTHER PUBLICATIONS

International Search Report issued in International Application No. PCT/JP2015/079755, dated Nov. 24, 2016.

(Continued)

*Primary Examiner* — Thomas Truong
(74) *Attorney, Agent, or Firm* — Arent Fox LLP (57) ABSTRACT

A micromechanical resonator is provided that enables a smaller total package size with an acceptable quality factor for timing applications. The MEMS resonator includes a vibration portion with a base and three or more vibrating beams extending therefrom. Moreover, the MEMS resonator includes a frame that surrounds a periphery of the vibration portion and a pair of anchor between the vibrating beams for stabilizing the vibration portion within the frame. Furthermore, support beams couple the base of the vibration portion to the pair of anchors.

20 Claims, 8 Drawing Sheets

(56) References Cited

U.S. PATENT DOCUMENTS

| | | | |
|---|---|---|---|
| 8,227,958 B2 | 7/2012 | Inoue et al. | |
| 8,347,719 B2 | 1/2013 | Ichikawa | |
| 8,415,863 B2 | 4/2013 | Yamazaki et al. | |
| 9,748,921 B2 | 8/2017 | Yamazaki et al. | |
| 2008/0134781 A1* | 6/2008 | Noguchi | G01C 19/5642 73/504.15 |
| 2008/0290490 A1* | 11/2008 | Fujii | B81B 7/007 257/684 |
| 2009/0174286 A1 | 7/2009 | Yoshimatsu et al. | |
| 2009/0178260 A1 | 7/2009 | Yamazaki et al. | |
| 2010/0079040 A1 | 4/2010 | Iwai | |
| 2010/0133958 A1 | 6/2010 | Umeki et al. | |
| 2010/0156246 A1 | 6/2010 | Iwai | |
| 2010/0201221 A1 | 8/2010 | Inoue et al. | |
| 2012/0212109 A1 | 8/2012 | Yamazaki et al. | |
| 2013/0283910 A1 | 10/2013 | Nishizawa et al. | |
| 2013/0305824 A1 | 11/2013 | Nishizawa et al. | |
| 2014/0084752 A1* | 3/2014 | Miyasaka | G01C 19/5628 310/348 |
| 2014/0290362 A1 | 10/2014 | Nakagawa et al. | |
| 2016/0197597 A1 | 7/2016 | Yamada et al. | |
| 2016/0290802 A1 | 10/2016 | Nagagawa | |
| 2017/0179926 A1 | 6/2017 | Hirota et al. | |
| 2018/0048288 A1 | 2/2018 | Hirota et al. | |

FOREIGN PATENT DOCUMENTS

| | | |
|---|---|---|
| JP | S56-85922 A | 7/1981 |
| JP | S58-111515 A | 7/1983 |
| JP | 2007-123683 A | 5/2007 |
| JP | 2009-089231 A | 4/2009 |
| JP | 2009-171118 A | 7/2009 |
| JP | 2010-187054 A | 8/2010 |
| JP | 2010-283804 A | 12/2010 |
| JP | 5071058 B2 | 11/2012 |
| JP | 2015-33087 A | 2/2015 |
| WO | WO 2015/041152 A1 | 3/2015 |
| WO | WO 2016/175161 A1 | 11/2016 |

OTHER PUBLICATIONS

International Search Report issued in International Application No. PCT/JP2016/062873, dated Jul. 12, 2016.

International Search Report issued in International Application No. PCT/JP2016/063115, dated Jul. 19, 2016.

Written Opinion of the International Searching Authority issued in International Application No. PCT/JP2015/079755, dated Nov. 24, 2016.

Written Opinion of the International Searching Authority issued in International Application No. PCT/JP2016/062873, dated Jul. 12, 2016.

Written Opinion of the International Searching Authority issued in International Application No. PCT/JP2016/063115. dated Jul. 19, 2016.

* cited by examiner

MICROMECHANICAL RESONATOR HAVING REDUCED SIZE

FIELD OF THE INVENTION

The present disclosure relates generally to a resonator structure, and, more particularly, to a micromechanical resonator with reduced size.

BACKGROUND OF THE INVENTION

Micromechanical resonators are currently used in gyroscope sensors and in timing references, for example. Recently, micromechanical tuning fork resonators have also been used as clock references vibrating at frequency of 32,768 Hz. As a result, small sized micro-machined resonators now compete with quartz-based solutions, which are facing increasing challenges in meeting smaller sizes since the frequency at which a quartz crystal resonator vibrates depends on its physical dimensions. In other words, the size dimensions of quartz crystal resonator will limit the devices ability to vibrate efficiently at certain desired frequencies.

Figure 1:
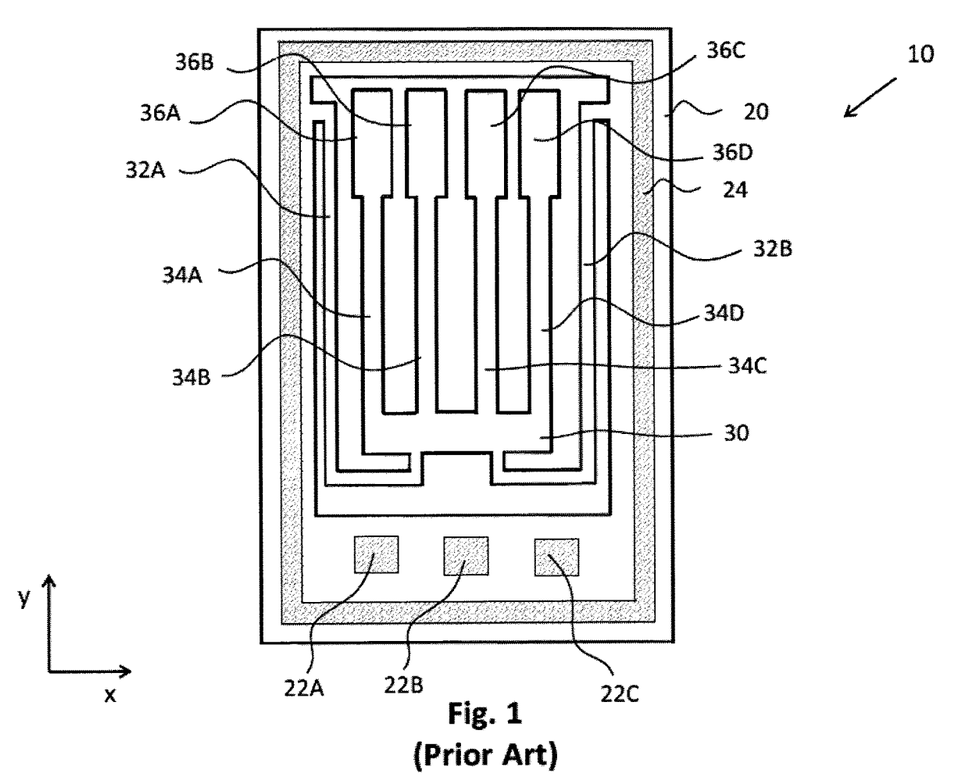
FIG. 1 illustrates a top view of a conventional micromechanical resonator structure.

Thus, a micro-machined resonator structure is disclosed in Patent Document 1 (identified below) that is suitable for providing small sized frequency reference vibrating at 32,768 Hz. FIG. 1 illustrates a top view of the conventional micromechanical resonator structure as disclosed in Patent Document 1.

As shown in FIG. 1, the resonator 10 includes a frame 20 with a metal bonding ring 24 extending around the frame 20 and plurality of via contacts 22A, 22B and 22C provided for external electrical contact for the resonator 10 to receive power during operation. Moreover, the resonator 10 has four beams 34A-34D that extend from a base 30 and that are structurally configured to vibrate in the z-direction during excitation of the resonator 10.

Patent Document: WO 2016/175161.

In such existing designs as that disclosed in Patent Document 1, the beams 34A-34D are made of a single crystal silicon and have a piezoelectric transducer formed on top of the surface of the beams 34A-34D. The beams for such a device will typically have a length of 400-650 µm for the length, a width of 40-60 µm, and a height of 4-6 µm. Moreover, the piezoelectric transducer is typically made of AlN (aluminum nitride) with a metal (e.g. molybdenum) electrodes. To reduce the length of the resonator 10, existing devices have used weights (e.g., weights 36A-36D) on the end of the beams, respectively, as masses to facilitate vibration during excitation.

According to design shown in FIG. 1, the vibrating beams 34A-34D are connected to a joint base 30. Moreover, the base 30 is connected to the frame 20 surrounding the resonator 10 with a pair of support beams 32A and 32B. As further shown, the support beams 32A and 32B originate from the base 30 from the side opposite of where the vibrating beams 34A-34D are connected and extend. In this design, the support beams 32A and 32B provide mechanical anchoring and are also used for electrical connections to the vibrating beams 34A to 34D. To connect the resonator 10 to an outside package, the frame has electrical via contacts 22A-22C as described above.

Although the vibrating resonator structure 10 (i.e., the vibrating beams 34A-34D and the base 30) disclosed in Patent Document 1 is quite small, the entire resonator structure (including the frame 20) is necessarily significantly larger than the vibrating portion itself of the resonator 10. This larger size is needed because the resonator needs to be hermetically enclosed inside the package and also to provide sufficient structure for the electrical connections of the vibrating beams 34A-34D. That is, the area for the frame 20 is used for attachment of a cap with the metal bonding ring 24 and for making electrical connections with the via contact 22A-22C. In particular, the via contacts 22A-22C outside the resonator 10 that are needed for electrical connections require a significant amount of space that increases the total package size of the device.

SUMMARY OF THE INVENTION

Accordingly, the present disclosure provides microelectromechanical system ("MEMS") resonator structure that enables a smaller total package size for micromechanical resonators than conventional designs.

In one embodiment, a MEMS resonator is provided that includes a vibration portion having a base with at least three vibrating beams extending from the base; a frame that at least partially surrounds a periphery of the vibration portion; at least one anchor disposed between a pair of the at least three vibrating beams and configured to stabilize the vibration portion within the frame; and at least one support beam coupling the base of the vibration portion to the at least one anchor.

In another exemplary aspect, the at least three vibrating beams comprises four vibrating beams and the at least one anchor comprises a pair of anchors.

In another exemplary aspect, a first anchor of the pair of anchors is disposed between a first pair of the vibrating beams and a second anchor of the pair of anchors is disposed between a second pair of the vibrating beams.

In another exemplary aspect, the at least one support beam comprises a pair of support beams respectively coupling the pair of anchors to the base of the vibration portion.

In another exemplary aspect, the MEMS resonator further includes a plurality of masses disposed on the vibrating beams, respectively, and wherein the plurality of masses are offset in a lengthwise direction relative to a center axis of the respective vibrating beams, such that a space is defined between each of the first and second pairs of vibrating beams with the respective first and second anchors disposed in the defined spaces.

In another exemplary aspect, the MEMS resonator further includes a substrate having a cavity with the frame coupled to the substrate, such that the vibration portion is disposed in the cavity.

In another exemplary aspect, the MEMS resonator further includes at least one support post extending from the substrate and connected to the at least one anchor, respectively, to stabilize the vibration portion within the cavity of the substrate.

In another exemplary aspect, the MEMS resonator further includes at least one electrical contact disposed on the at least one anchor, respectively.

In another exemplary aspect, the MEMS resonator further includes a resonator cap having a concave cavity and disposed on the frame to hermetically seal the vibration portion within concave cavity with the frame surrounding the vibration portion.

In another exemplary aspect, the resonator cap comprises at least one electrical feedthrough extending therethrough and connected to the at least one electrical contact disposed on the at least one anchor, respectively.

In another exemplary aspect, the MEMS resonator further includes a substrate having a cavity with the frame coupled to the substrate, such that the vibration portion is disposed in the cavity; and at least one support post extending from the substrate and connected to the at least one anchor, respectively, to stabilize the vibration portion within the cavity of the substrate.

In another exemplary aspect, the at least one support post is aligned with the at least one electrical feedthrough in a plan view of the MEMS resonator.

In another exemplary aspect, the at least one support beam linearly and directly couples the base of the vibration portion to the at least one anchor.

In another exemplary aspect, the at least one support beam comprises a plurality of arms coupled to each other in a folded configuration to flexibly couple the base of the vibration portion to the at least one anchor.

In another exemplary aspect, the MEMS resonator further includes at least one frame connecting beam physically and electrically connecting the at least one anchor to a side of the frame, wherein the at least one frame connecting beam is disposed between a pair of the at least three vibrating beams and extends in a direction parallel thereto.

In another exemplary embodiment, a MEMS resonator is provided that includes a vibration portion includes a base, a pair of outer vibrating beams extending from the base, and at least one inner vibrating beam extending from the base between the pair of outer vibrating beams and extending in a direction parallel thereto; a pair of anchors configured to stabilize the vibration portion within a frame surrounding the vibration portion; and a pair of support beams coupling the base of the vibration portion to the pair of anchors, wherein a first anchor of the pair of anchors is disposed between one of the outer vibrating beams and the at least one inner vibrating beam, and a second anchor of the pair of anchors is disposed between the other of the outer vibrating beams and the at least one inner vibrating beam.

In a refinement of the exemplary aspect, the MEMS resonator further includes a plurality of masses respectively disposed on the pair of outer vibrating beams and the at least one inner vibrating beam, and wherein the plurality of masses are offset in a lengthwise direction relative to a center axis of the respective vibrating beams, such that a pair of space are defined between the respective vibrating beams to accommodate the first and second anchors, respectively.

In another refinement of the exemplary aspect, the MEMS resonator further includes a substrate having a cavity with the frame coupled to the substrate, such that the vibration portion is disposed in the cavity; and a pair of support posts extending from the substrate and connected to the pair of anchors, respectively, to stabilize the vibration portion within the cavity of the substrate.

In another refinement of the exemplary aspect, the MEMS resonator further includes a resonator cap having a concave cavity and disposed on the frame to hermetically seal the vibration portion within concave cavity with the frame surrounding the vibration portion; and a pair of electrical feedthroughs extending through the resonator cap and connected to a pair of electrical contacts disposed on the pair of anchors, respectively, wherein the pair of support posts are respectively aligned with the pair of electrical feedthroughs in a plan view of the MEMS resonator.

In another refinement of the exemplary aspect, the MEMS resonator further includes a pair of frame connecting beams physically and electrically connecting the pair of anchors to a side of the frame, wherein the pair of frame connecting beams are respectively disposed between the at least one inner vibrating beam and the pair of outer vibrating beams and extend in a direction parallel thereto.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EMBODIMENTS

Example aspects are described herein in the context of a micromechanical ("MEMS") resonator that enables a smaller total package size for micromechanical resonators than conventional designs. For example, in one aspect, the resonator structures disclosed herein are suitable for clock resonators vibrating at 32,768 Hz, for example. In another aspect, the exemplary MEMS resonators can also be used for very small sized gyroscope structures.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 2:
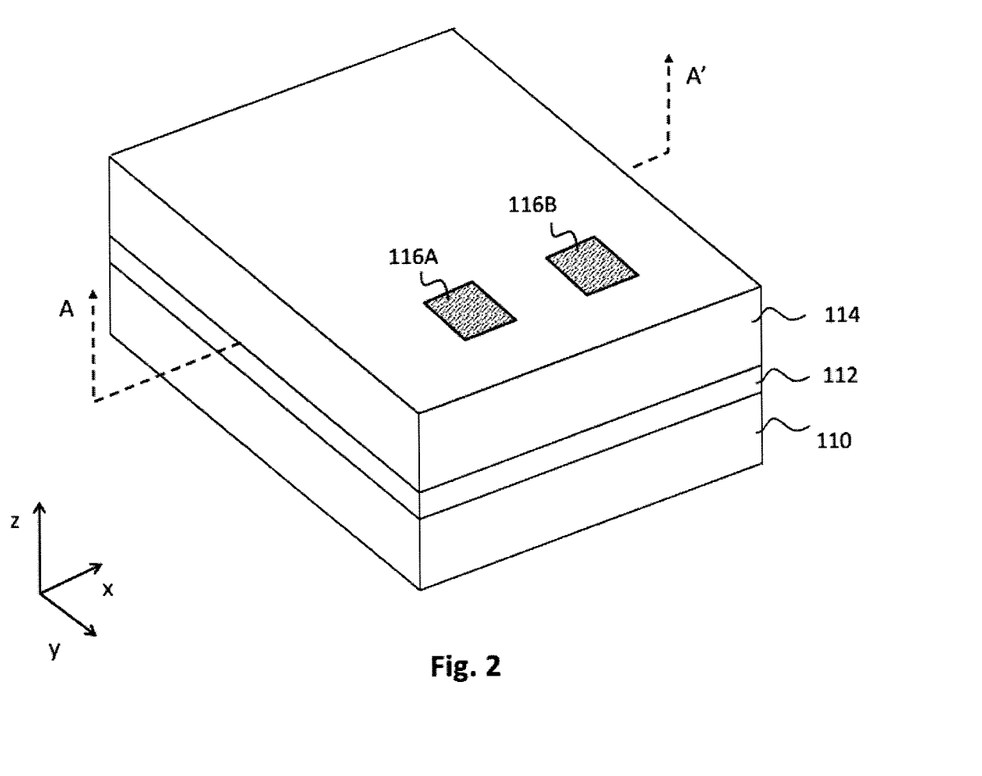
FIG. 2 illustrates an outer perspective view of a micromechanical resonator in accordance with an exemplary embodiment.

FIG. 2 illustrates an outer perspective view of a MEMS resonator device in accordance with an exemplary embodiment. As shown, the MEMS resonator device includes a frame 112 and a resonator cap 114 that are provided upon a substrate 110. As will be discussed in detail below and shown in FIG. 4, for example, substrate 110 includes a concave cavity in a central area thereof, such that a MEMS resonator, and in particular the vibration beams, inside the MEMS resonator device is capable of vibrating above the cavity.

Preferably, the MEMS resonator device of the exemplary embodiment is manufactured with MEMS manufacturing techniques, for example, as described in "Fundamentals of Microfabrication and Nanotechnology, Volume II: Manufacturing Techniques for Microfabrication and Nanotechnology", by Marc J. Madou, CRC Press, 2011. Thus, according to the exemplary embodiment, the MEMS resonator device is a chip scale packaged ("CSP") micromechanical resonator. Preferably, the MEMS resonator device is fabricated of cavity silicon-on-insulator ("SOI") wafers with the substrate 110 made of silicon, the frame 112 made of SOI silicon, and the resonator cap 114 visible to outside. As further shown, a plurality of electrical contact pads (e.g., a pair of contact pads 116A and 116B) are provided on top of the resonator cap 114 for connecting the resonator to external circuitry (e.g., oscillation circuitry), as would be understood to one skilled in the art.

Figure 3:
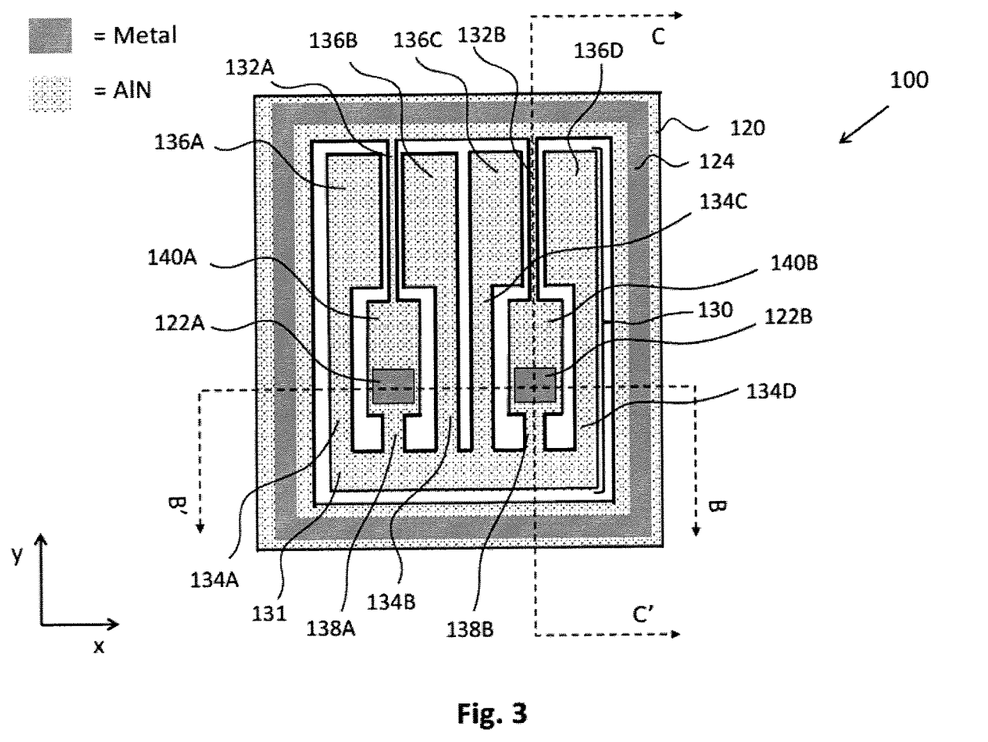
FIG. 3 illustrates a cross-sectional view of the MEMS resonator of FIG. 2 in accordance with an exemplary embodiment.

FIG. 3 illustrates a cross-sectional view of the MEMS resonator of FIG. 2 in accordance with an exemplary embodiment. In particular, the cross-sectional view of the packaged MEMS resonator 100 is taken along lines A-A' of FIG. 2.

According to the exemplary aspect, the MEMS resonator 100 generally includes a vibrating portion 130 disposed within a frame 120 (also considered a holding portion of the vibration portion 130) and a pair of anchors that secure and stabilize the vibration portion 130 within the frame 120.

As shown in FIG. 3, the vibration portion 130 preferably has a plate-like contour that extends in a planar form along the XY plane in an orthogonal coordinate system. The vibration portion 130 is provided within the frame 120 and a space is formed at a predetermined interval between the vibration portion 130 and the holding portion 120.

According to the exemplary aspect, the vibration portion 130 has a base 131 and four vibration beams or arms 134A to 134D extending therefrom. As shown, the respective vibration beams 134A to 134D are provided between the base 131 and the frame 120 so as to be in parallel with the y-axis direction. The vibration beams 134A to 134D have first ends as fixed ends connected to the base 131 and extend in the direction away from the base 131 with second ends as free or open ends.

Moreover, in the exemplary embodiment, the respective vibration beams 134A to 134D are formed integrally with the base 131. In addition, the four vibrating beams 134A to 134D are configured to vibrate out-of-plane (i.e., in the z-direction) during operation of the MEMS resonator device. That is, two of the beams will move up while two of the beams will move down and so forth. This antiphase movement balances the momentum so that net momentum of four vibrating beams 134A to 134D combined is always zero in the z-direction and the anchor losses are minimized. It should also be appreciated that the number of vibration beams is not limited to four and is set to the desired number, for example, equal to or more than three, as will be discussed in detail below with respect to FIG. 6, for example.

According to the exemplary aspect, the base 131 is a substantially rectangular parallelepiped-shaped plate having a pair of longer sides extending in the X-axis direction and a pair of shorter sides extending in the Y-axis direction. It is noted that the base 131 is not limited to having the rectangular parallelepiped shape and it is sufficient that it is formed to have a substantially plane-symmetric shape with respect to a plane defined along a perpendicular bisector of the longer sides. Moreover, it is noted that the term "substantially", as used herein, takes into account minor variations in the dimensions that may occur as a result of the manufacturing process as would be appreciated to one skilled in the art, for example.

According to the exemplary embodiment of FIG. 3, the base 131 is connected to the frame 120 on a longer side of the base 131 with a pair of support beams 138A and 138B. More particularly, a pair of anchors 140A and 140B are placed between the vibrating beams 134A to 134D to provide a fixed support for the MEMS resonator 100. Thus, according to the exemplary aspect, anchor 140A is disposed between vibrating beams 134A and 134B and anchor 140B is disposed between vibrating beams 134C and 134D. As will be described in detail below, the anchors 140A and 140B are stabilized by a corresponding pair of supports posts that extend in the z-axis direction from the base of substrate 112.

As further shown, a pair of support beams 138A and 138B respectively connect the resonator base 131 to the anchors 140A and 140B. Advantageously, the support beams 138A and 138B can be disposed between the vibrating beams 134A to 134D, as shown, on the same side of the base without significantly reducing the quality factor of the MEMS resonator 100. Moreover, for stability, the anchors 140A and 140B preferably have a width in the x-axis direction that is greater than the support beams 138A and 138B.

Moreover, a pair of electrical via contacts 122A and 122B are respectively provided on the pair of anchors 140A and 140B to provide for electronical connection to outside of the package, for example, to electrical contact pads 116A and 116B, respectively, as discussed above with respect to FIG. 2.

According to the exemplary aspect, the pair of anchors 140A and 140B are coupled to a side of the frame opposite the base (i.e., in the y-axis direction). That is, the anchor 140A and 140B are coupled to the resonator frame 120 by a pair of frame connecting beams 132A and 132B extending between the vibrating beams 134A to 134D. As shown, frame connecting beam 132A extends from anchor 140A and between vibrating beams 134A and 134B to connect to the frame 120. Moreover, frame connecting beam 132B extends from anchor 140B and between vibrating beams 134C and 134D to also connect to the frame 120. Thus, in the exemplary aspect, the frame connecting beams 132A and 132B extend in a direction parallel to the vibrating beams 134A to 134D. Moreover, in this aspect, the support beam 138A, anchor 140A and frame connecting beam 132A are symmetrically designed with respect to the support beam 138B, anchor 140B and frame connecting beam 132B in the y-axis direction of the MEMS resonator 100.

In the exemplary aspect, the frame connecting beams 132A and 132B provide for the electrical connection between the vibrating portion 130 and the frame 120. Thus, the frame connecting beams 132 allow for electrical connection between frame 120 and vibrating portion 130 in order to reduce the number of electrical feedthroughs (discussed below) that are needed in the anchor areas to operate the resonator. However, it should be appreciated that in an alternative aspect of the exemplary embodiment, it is also possible to connect the frame 120 and vibrating portion 130 electronically primarily (or solely) using electrical feedthroughs in the resonator cap. In addition, the resonator frame 120 includes a metal bonding ring 124 for mounting the package cap, for example, resonator cap 114 as described above with respect to FIG. 2.

According to yet a further aspect of the exemplary embodiment, respective weights or masses 136A to 136D can be provided at the end of each of the vibrating beams 134A and 134D, respectively. Thus, as shown, the vibrating beams 134A and 134D each have a first width (i.e., in the x-axis direction) at a point where the vibrating beams 134A and 134D extend from the base 131 and the masses 136A to 136D each have a second width (i.e., in the x-axis direction) greater than the first width. Advantageously, the masses 136A to 136D help further reduce the length of the MEMS resonator 100 in the y-axis direction and utilize space in the cavity of the substrate that is otherwise not used. Preferably, the center of each of the masses 136A to 136D not aligned along the center axis of the respective vibrating beams 134A to 134D, but instead is offset to create space for the anchors 140A and 140D. Thus, as shown, the outer edges of masses 136A and 136D align with the outer edges of the outside vibrating beams 134A and 134D, which are also parallel with the longer sides of the frame 120 in the y-axis direction. Moreover, the inner edges of masses 136B and 136C align with the inner edges of the inside vibrating beams 134B and 134C, which are also parallel with the longer sides of the frame 120 in the y-axis direction. As a result, a space is defined between the vibrating beams 134A and 134B for anchor 140A and another space is defined between the vibrating beams 134C and 134D for anchor 140B.

Accordingly, the MEMS resonator 100 occupies a rectangular space and fits in a rectangular package without wasting any space. For example, according to an exemplary aspect, the MEMS resonator 100 as shown in FIG. 3 can have a length (i.e., in the y-axis direction) of 700 µm or less. In contrast, a conventional design, such as the resonator shown in FIG. 1 and described above, will have a length of approximately 900 µm. Thus, the exemplary design of FIG. 3 reduces the total length by over 20% from conventional designs, which is substantial as the requirements for such devices continue to be made for smaller devices.

Figure 4:
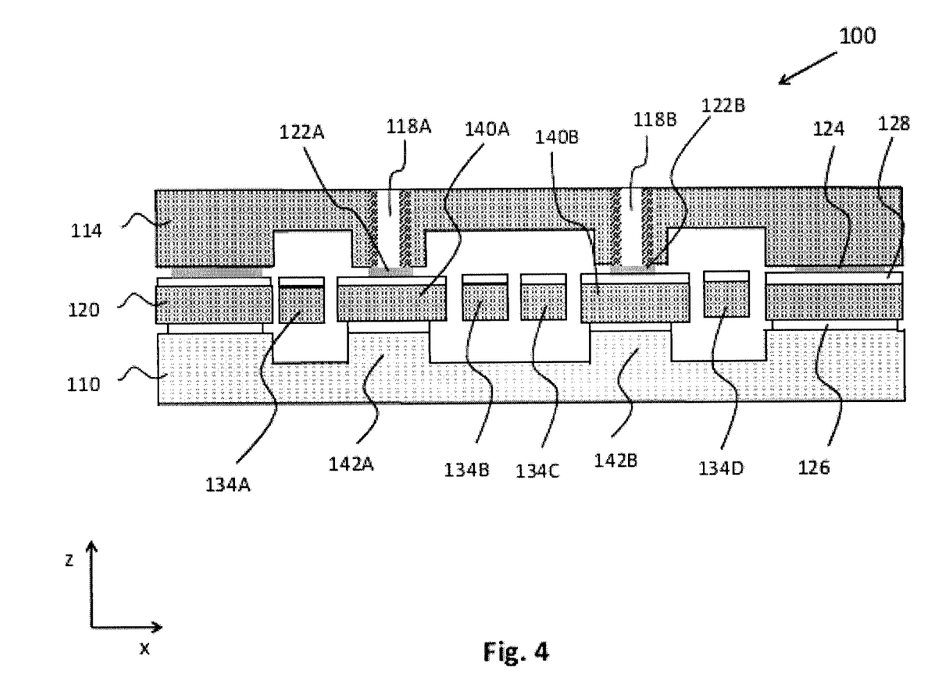
FIG. 4 illustrates a cross-sectional view of the MEMS resonator of FIG. 3 taken along lines B-B' in accordance with an exemplary embodiment.
Figure 5:
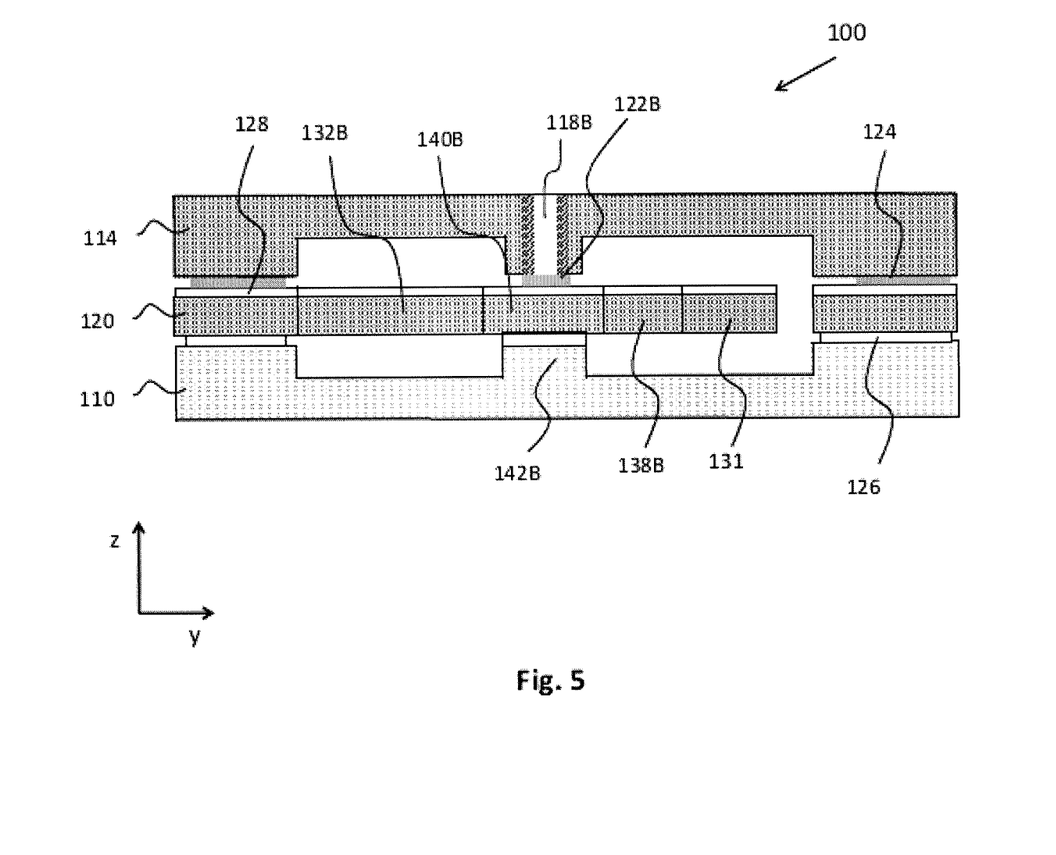
FIG. 5 illustrates a cross-sectional view of the MEMS resonator of FIG. 3 taken along lines C-C' in accordance with an exemplary embodiment.

FIGS. 4 and 5 illustrate cross-sectional views of the MEMS resonator 100 of FIG. 3 in accordance with an exemplary embodiment. In particular, the cross-sectional view shown in FIG. 4 of the packaged MEMS resonator 100 is taken along lines B-B' of FIG. 3 and is a cross-section in the z-axis direction and x-axis direction. Moreover, the cross-sectional view shown in FIG. 5 of the packaged MEMS resonator 100 is taken along lines C-C' of FIG. 3 and is a cross-section in the z-axis direction and y-axis direction. The respective cross-section views of FIGS. 4 and 5 illustrate the same exemplary embodiment, and, therefore, the descriptions of the exemplary configurations and components will be described collectively as follows.

As illustrated in FIGS. 4 and 5, the MEMS resonator 100 according to the exemplary embodiment includes the frame 120 that is secured (e.g., bonded) to side walls of a lower lid, i.e., substrate 110, and an upper lid, i.e., resonator cap 114. Thus, the frame 120 of the MEMS resonator 100 is held between the substrate 110 and the resonator cap 114, with the substrate 110 and the resonator cap 114 each effectively forming and defining a cavity/space in which the vibration portion (i.e., the resonator) that includes the vibration beams 134A to 134D extend therein and vibrate during operation of the MEMS device. In an exemplary aspect, the cavity depth of the substrate 110 can be between 25 µm and 100 µm.

According to an exemplary aspect, the substrate 110 (e.g., the bottom plate and side walls extending in the z-axis direction) are integrally formed with Si (silicon). Moreover, a SiO$_2$ (silicon dioxide) film 126 is formed on the upper surface of the side walls of the substrate 110, such that the silicon substrate 110 and the frame 120 of the MEMS resonator 100 are bonded to each other by the SiO$_2$ film 126.

In addition, according to the exemplary aspect, the resonating structure is formed from a single crystal silicon (e.g., SOI silicon) with layers of piezoelectric material 128 (e.g., aluminum nitride) and metals (i.e., via contacts 122A and 122B) on top of the silicon. For example, in an exemplary aspect, the resonator may be a single crystal silicon with layers of molybdenum (i.e., via contacts 122A and 122B) and aluminum nitride (i.e., piezoelectric layers 128) disposed on top thereof for piezoelectric transduction, as would be appreciated to one skilled in the art.

As further shown, the resonator cap 114 can include a plurality of electrical feedthroughs 118A and 118B (e.g., metal vias) that extend through the cap 114 and that electrically connect the via contacts 122A and 122B on the respective anchors 140A and 140B to the electrical contact pads 116A and 116B, respectively. In the exemplary aspect, the metal bonding ring 124 is disposed on the outer circumference of the frame 120 (e.g., on the piezoelectric layer 128) and provided to seal the resonator and the electrical feedthroughs 118A and 118B when the resonator cap 114 presses against the via contacts 122A and 122B on top of the anchors 140A and 140B.

Moreover, according to the exemplary aspect, the substrate 110 includes a pair of support posts 142A and 142B that extend upward from the bottom layer of the substrate 110 and are under (and aligned with) the anchors 140A and 140B, respectively. Advantageously, support posts 142A and 142B are provided to solidly mount the resonating structure (i.e., the vibrating beams 134A to 134D connected to the base 131) with the anchors 140A and 140B fixed or bonded to the support posts 142A and 142B, respectively. Preferably, the support posts 142A and 142B are integrally formed with the substrate 110.

According to the exemplary aspect, it is important that anchors 140A and 140B are well supported and that the support posts 142A and 142B of the substrate 110 and the electrical feedthroughs 118A and 118B are aligned or approximately aligned to obtain good electrical connection for the MEMS resonator device. That is the electrical feedthroughs 118A and 118B are aligned in the vertical direction (i.e., the z-axis direction) with the via contacts 122A and 122B and thus the pair of anchors 140A and 140B.

Moreover, in an exemplary aspect, the electrical feedthroughs 118A and 118B are typically made of polycrystalline silicon and are insulated from the rest of the cap 114 by a layer of silicon dioxide.

As shown in FIG. 5, the support posts (e.g., support post 142B) has a smaller width in the y-axis direction than the respective anchor 140B stabilized thereby. However, it should be appreciated that the support posts 142A and 142B can have the same, slightly bigger or slightly smaller width than the respective anchors 140A and 140B as long as the support posts 142A and 142B have a sufficient width to stabilize the vibration portion 130 (i.e., the resonator) within the frame 120.

Figure 6:
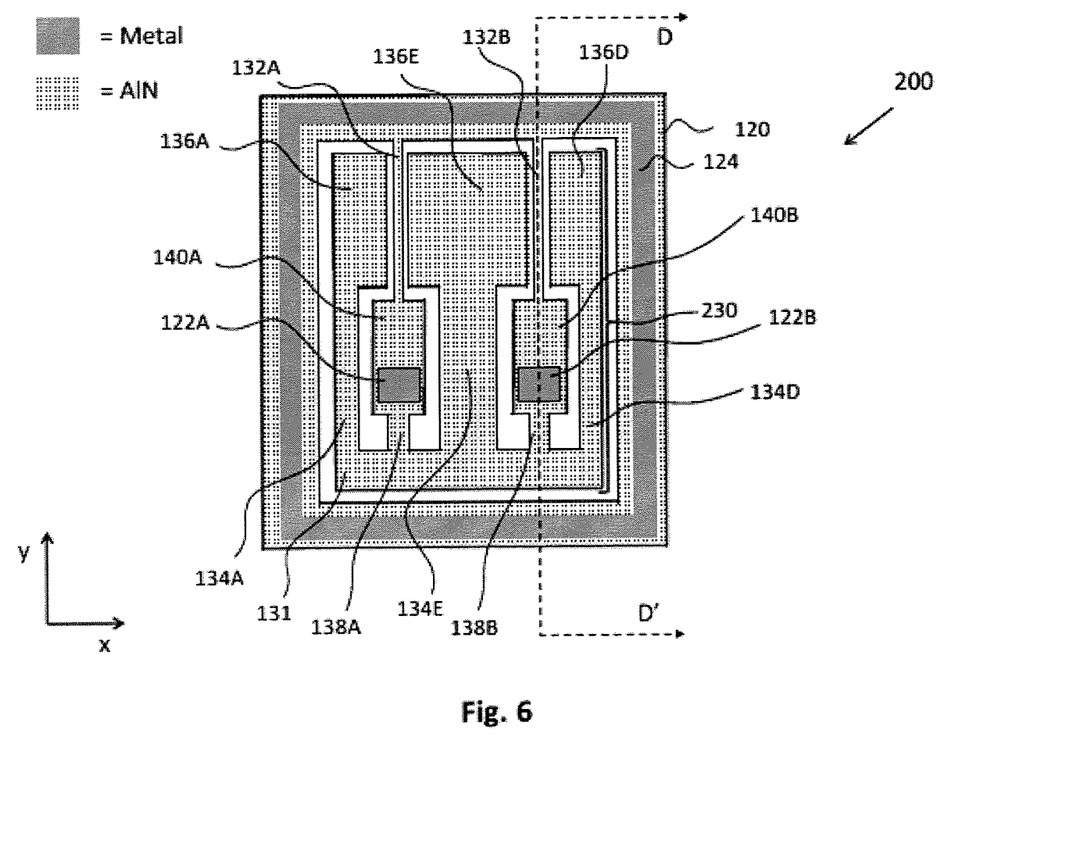
FIG. 6 illustrates a cross-sectional view of a MEMS resonator in accordance with another exemplary embodiment.

FIG. 6 illustrates a cross-sectional view of a MEMS resonator in accordance with another exemplary embodiment. In the second and subsequent embodiments, description of common matters and components to those in the first exemplary embodiment described above are omitted and only different points will be described. In particular, the same effects with the same structures are not referred in each embodiment.

Thus, FIG. 6 illustrates a top view of another exemplary embodiment of a MEMS resonator 200. In general, the MEMS resonator 200 includes many of the same features of MEMS resonator 100 described above, including a vibration portion 230 with the symmetrical configurations of support beam 138A, anchor 140A and frame connecting beam 132A symmetrically disposed with respect to support beam 138B, anchor 140B and frame connecting beam 132B, relative to the y-axis direction. Thus, the MEMS resonator 200 will have the same cross-sectional configuration (i.e., the view taken along lines D-D') that is described above with respect to FIG. 5 and that is taken as a cross-section in the z-axis direction and y-axis direction. As a result, the MEMS resonator 200 advantageously achieves the same compact size for the MEMS resonator structure described above with respect to the first exemplary embodiment.

However, as shown in the exemplary embodiment of FIG. 6, the MEMS resonator 200 has only three vibrating beams 134A, 134D and 134E that extend from the base 131 and that are configured to vibrate out-of-phase in the z-axis direction. The vibrating beams 134A and 134D can be considered outer vibrating beams as they are closest to the sides of the frame 120 surrounding the resonator whereas the vibrating beam 134E can be considered an inner vibrating beam as it is disposed between the outer vibrating beams 134A and 134D.

According to the exemplary aspect, each of the three vibrating beams 134A, 134D and 134E includes a respective mass 136A, 136D and 136E attached to the free end thereof. Moreover, the center vibrating beam 134E and mass 136E has a wider width (i.e., in the x-axis direction) than the vibrating beams 134A and 134D and masses 136A and 136D, which have the same width in the x-axis direction as one another. In this exemplary embodiment, when the center vibrating beam 134E moves up, the side vibrating beams 134A and 134D move down and vice versa during excitation of the MEMS resonator 200.

In general, for different resonator structures, the inventors have found that a resonator will tend to shows positive drive level dependency ("DLD") where the resonance frequency increases with increasing signal amplitude. This is undesirable for frequency reference applications. Accordingly, the inventors have also determined that DLD can be reduced or eliminated by folding the support beam connecting the base of the MEMS resonator to the respective pair of anchors.

Figure 7:
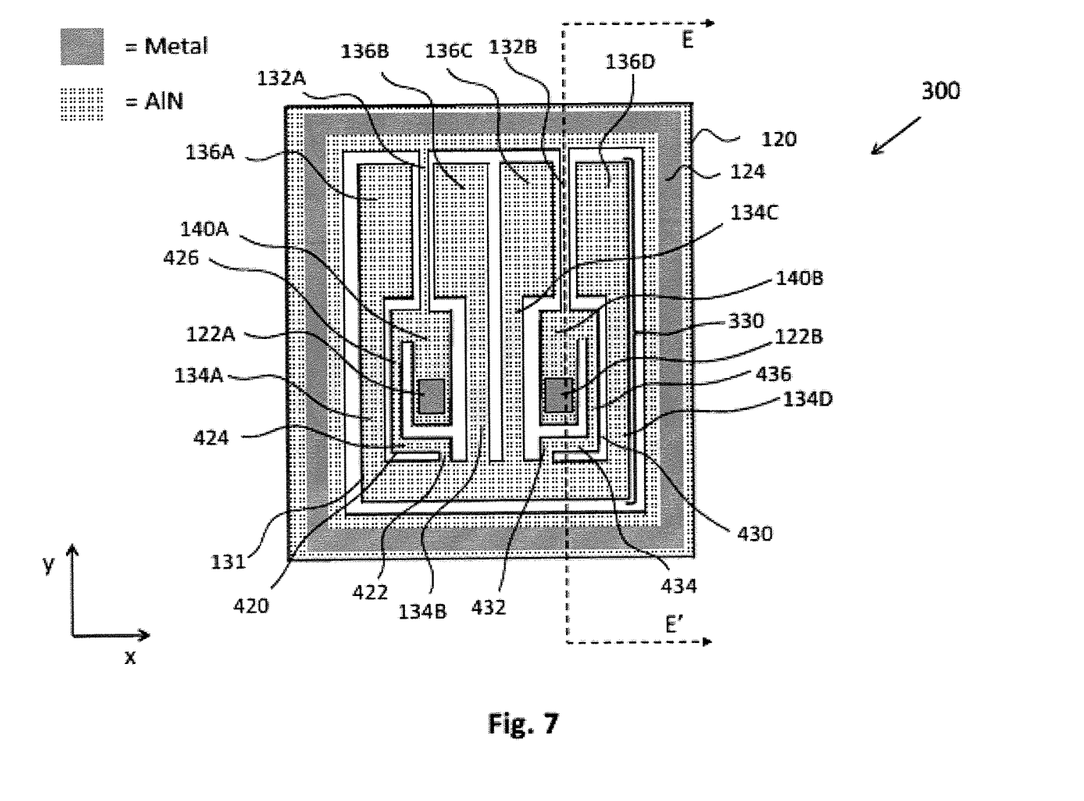
FIG. 7 illustrates a top view of the MEMS resonator according to another exemplary embodiment.

Thus, FIG. 7 illustrates a top view of the MEMS resonator according to another exemplary embodiment. In general, the MEMS resonator 300 of the exemplary embodiment comprises many of the same components and design configurations as the MEMS resonators described above in the other exemplary embodiments. Thus, description of common matters and components are omitted and only different points will be described.

According to the exemplary embodiment, the MEMS resonator 300 includes vibration portion 330 with a pair of support beams 420 and 430 that connect the anchors 140A and 140B to the base 131. However, in the exemplary embodiment of MEMS resonator 100, as described above with respect to FIG. 3, the support beams 138A and 138B were linear arms that each extended in the y-axis direction and connected one side of the base 131 directly to the opposing side of each of the pair of anchors 140A and 140B.

In contrast, in the exemplary aspect of FIG. 7, the pair of support beams 420 and 430 each have a plurality of turns to connect each beam to the respective sides of the anchors 140A and 140B facing (i.e., next to) the opposing vibrating beams 134A and 134D. In particular, support beam 420 has a first arm 422 extending from the base 131 in the y-axis direction, a second arm 424 extending from the first arm 422 in the x-axis direction, and a third arm 426 extending from the second arm 424 in the y-axis direction and connected to the side of anchor 140A. Moreover, a space or gap 428 is provided between the third arm 426 and the anchor 140A.

Support beam 430 has a similar configuration as support beam 420 and is preferably symmetrically disposed about the y-axis direction. Thus, according to the exemplary aspect, support beam 430 has a first arm 432 extending from the base 131 in the y-axis direction, a second arm 434 extending from the first arm 432 in the x-axis direction, and a third arm 436 extending from the second arm 434 in the y-axis direction and connected to the side of anchor 140A. Moreover, a space or gap 438 is provided between the third arm 436 and the anchor 140A.

According to the exemplary design of the MEMS resonator 300, the configuration of support beams 420 and 430 with the turns of the respective second arms 424 and 434 effectively makes the support beams 420 and 430 longer and more flexible than the linear support beams of the embodiments described above. Advantageously, this flexibility in turn reduces the DLD, and, thereby, improves frequency reference applications provided by the exemplary MEMS resonator device.

Moreover, it should be appreciated to one skilled in the art that the specific turning configuration shown in FIG. 7 is only an exemplary design and that there are many different structural configurations in which the support beams 420 and 430 can be made longer and more flexible. For example, the support beams have two turns in this embodiment, but may have three or more turns in additional embodiments.

Figure 8:
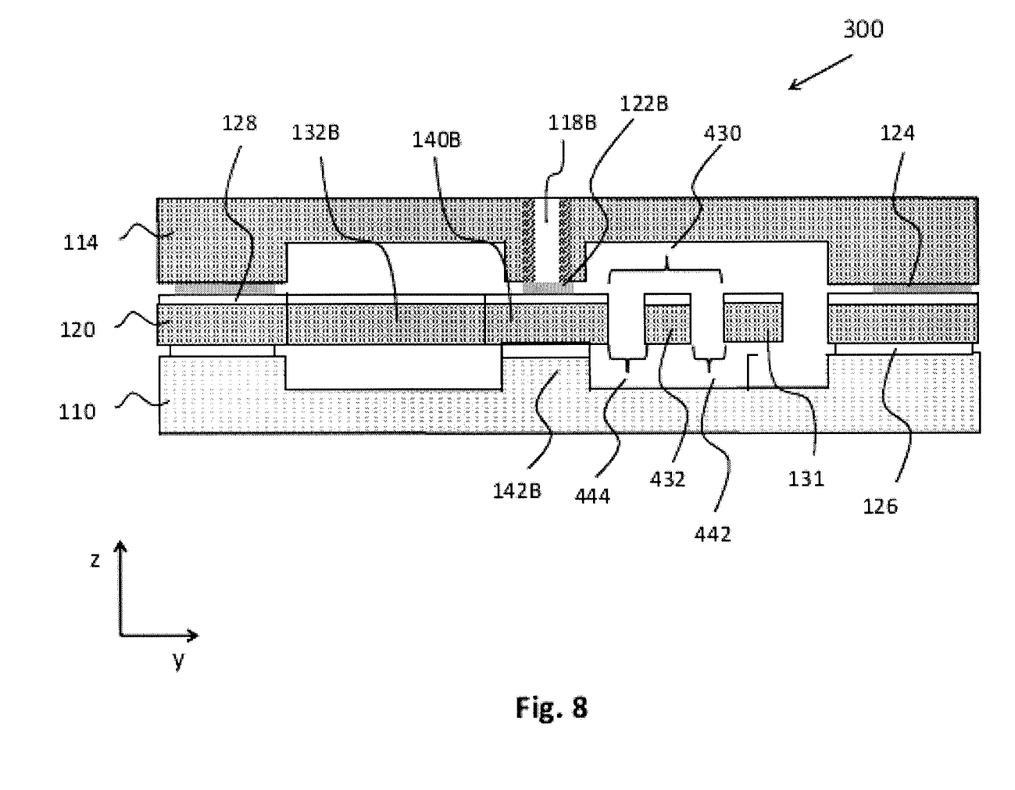
FIG. 8 illustrates a cross-sectional view of the MEMS resonator of FIG. 7 taken along lines E-E' in accordance with an exemplary embodiment.

FIG. 8 illustrates cross-sectional view of the MEMS resonator 300 of FIG. 7 in accordance with an exemplary embodiment. In particular, the cross-sectional view shown in FIG. 8 of the packaged MEMS resonator 300 is taken along lines E-E' of FIG. 7 and is a cross-section in the z-axis direction and y-axis direction.

As illustrated in FIG. 8, the MEMS resonator 300 according to the exemplary embodiment includes many of the same or similar components as described above in the embodiments shown in FIGS. 4 and 5, for example. Thus, as shown, MEMS resonator 300 includes the frame 120 that is secured (e.g., bonded) to side walls of a lower lid, i.e., substrate 110, and an upper lid, i.e., resonator cap 114. Thus, the frame 120 of the MEMS resonator 300 is likewise held between the substrate 110 and the resonator cap 114, with the substrate 110 and the resonator cap 114 effectively forming a cavity/space in which the vibration beams 134A to 134D extend therein and vibrate during operation of the MEMS device.

As further shown, the frame connecting beam 132B extends in the y-axis direction and connects a side of the silicon frame 120 to the anchor 140B. Moreover, the resonator cap 114 includes a plurality of electrical feedthroughs (i.e., electrical feedthrough 118B is shown from this perspective) that extend through the cap 114 and are electrically connected to the via contacts (i.e., via contact 122B is shown in this perspective) on the respective anchor 140B.

Moreover, according to the exemplary aspect, the substrate 110 includes a pair of support posts that extend upward from the bottom layer of the substrate 110 and are under (and aligned with) the pair of anchors. In the perspective of FIG. 8, support post 142B is provided to solidly mount the resonating structure with the anchor 140B fixed or bonded to the support posts 142B. As further described above, the support beams have a plurality of turns for improved flexibility. Thus, as shown, support beam 430 includes second arm 434 that extends in the x-axis direction, with gaps 442 and 444 created between the second arm 434 and the base 131 (i.e., gap 442) and between the second arm 434 and the anchor 140B (i.e., gap 444). It is noted that the first arm 432 and third arm 436 are not shown in FIG. 8 as the cross-sectional view is taken along line E-E' of FIG. 7 that does not cross these arms 432 and 436.

According to each of the exemplary embodiments described above, a MEMS resonator device is provided with a plurality of anchors (e.g., a pair of anchors) disposed between the respective vibration beams. Moreover, the anchors are stabilized to the substrate of the device by a pair of respective support posts extending therefrom. Advantageously, the support beams 138A and 138B can be disposed on the same side of the base as the vibrating arms without significantly reducing the quality factor of the MEMS resonator. By doing so, the device can be reduced by a total length of 20% or more as compared with conventional designs. Thus, the exemplary MEMS resonators can be used as clock resonators (e.g., vibrating at 32,768 Hz) or as gyroscope structures, offering significantly smaller size than such conventional devices.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST

100, 200, 300: MEMS resonator
110: substrate layer
112: frame
114: resonator cap
116A, 116B: electrical contact pads
118A, 118B: electrical feedthroughs
120: frame
122A, 122B: via contacts
124: metal bonding ring
126: silicon dioxide layer
128: piezoelectric layers
130: vibrating portion
132A, 132B: frame connecting beams
134A-134E: vibrating beams
136A-136E: masses
138A, 138B: support beams anchors
140A, 140B: anchors
142A, 142B: support posts
420, 430: support beams

The invention claimed is:

1. A MEMS resonator comprising:
   a vibration portion having a base with at least three vibrating beams extending from a same side surface of the base;
   a frame that at least partially surrounds a periphery of the vibration portion;
   at least one anchor disposed between a pair of the at least three vibrating beams and configured to stabilize the vibration portion within the frame; and
   at least one support beam coupling the base of the vibration portion to the at least one anchor,
   wherein the at least one support beam is coupled to the same side surface of the base as the side surface from which the at least three vibrating beams extend.

2. The MEMS resonator according to claim 1, wherein the at least three vibrating beams comprises four vibrating beams and the at least one anchor comprises a pair of anchors.

3. The MEMS resonator according to claim 2, wherein a first anchor of the pair of anchors is disposed between a first pair of the vibrating beams and a second anchor of the pair of anchors is disposed between a second pair of the vibrating beams.

4. The MEMS resonator according to claim 3, wherein the at least one support beam comprises a pair of support beams respectively coupling the pair of anchors to the base of the vibration portion.

5. The MEMS resonator according to claim 4, further comprising:
   a plurality of masses disposed on the vibrating beams, respectively, and
   wherein the plurality of masses are offset in a lengthwise direction relative to a center axis of the respective vibrating beams, such that a space is defined between each of the first and second pairs of vibrating beams with the respective first and second anchors disposed in the defined spaces.

6. The MEMS resonator according to claim 1, further comprising a substrate having a cavity with the frame coupled to the substrate, such that the vibration portion is disposed in the cavity.

7. The MEMS resonator according to claim 6, further comprising at least one support post extending from the substrate and connected to the at least one anchor, respectively, to stabilize the vibration portion within the cavity of the substrate.

8. The MEMS resonator according to claim 1, further comprising at least one electrical contact disposed on the at least one anchor, respectively.

9. The MEMS resonator according to claim 8, further comprising a resonator cap having a concave cavity and disposed on the frame to hermetically seal the vibration portion within concave cavity with the frame surrounding the vibration portion.

10. The MEMS resonator according to claim 9, wherein the resonator cap comprises at least one electrical feedthrough extending therethrough and connected to the at least one electrical contact disposed on the at least one anchor, respectively.

11. The MEMS resonator according to claim 10, further comprising:
a substrate having a cavity with the frame coupled to the substrate, such that the vibration portion is disposed in the cavity; and
at least one support post extending from the substrate and connected to the at least one anchor, respectively, to stabilize the vibration portion within the cavity of the substrate.

12. The MEMS resonator according to claim 11, wherein the at least one support post is aligned with the at least one electrical feedthrough in a plan view of the MEMS resonator.

13. The MEMS resonator according to claim 1, wherein the at least one support beam linearly and directly couples the base of the vibration portion to the at least one anchor.

14. The MEMS resonator according to claim 1, wherein the at least one support beam comprises a plurality of arms coupled to each other in a folded configuration to flexibly couple the base of the vibration portion to the at least one anchor.

15. A MEMS resonator comprising:
a vibration portion having a base with at least three vibrating beams extending from the base;
a frame that at least partially surrounds a periphery of the vibration portion;
at least one anchor disposed between a pair of the at least three vibrating beams and configured to stabilize the vibration portion within the frame;
at least one support beam coupling the base of the vibration portion to the at least one anchor; and
at least one frame connecting beam physically and electrically connecting the at least one anchor to a side of the frame,
wherein the at least one frame connecting beam is disposed between a pair of the at least three vibrating beams and extends in a direction parallel thereto.

16. A MEMS resonator comprising:
a vibration portion includes a base, a pair of outer vibrating beams extending from a same side surface of the base, and at least one inner vibrating beam extending from the same side surface of the base and between the pair of outer vibrating beams and extending in a direction parallel thereto;
a pair of anchors configured to stabilize the vibration portion within a frame surrounding the vibration portion; and
a pair of support beams coupling the base of the vibration portion to the pair of anchors,
wherein the pair of support beams are coupled to the same side surface of the base as the side surface from which the pair of outer vibrating beams and the at least one inner vibrating beam extend, and
wherein a first anchor of the pair of anchors is disposed between one of the outer vibrating beams and the at least one inner vibrating beam, and a second anchor of the pair of anchors is disposed between the other of the outer vibrating beams and the at least one inner vibrating beam.

17. The MEMS resonator according to claim 16, further comprising:
a plurality of masses respectively disposed on the pair of outer vibrating beams and the at least one inner vibrating beam, and
wherein the plurality of masses are offset in a lengthwise direction relative to a center axis of the respective vibrating beams, such that a pair of space are defined between the respective vibrating beams to accommodate the first and second anchors, respectively.

18. The MEMS resonator according to claim 16, further comprising:
a substrate having a cavity with the frame coupled to the substrate, such that the vibration portion is disposed in the cavity; and
a pair of support posts extending from the substrate and connected to the pair of anchors, respectively, to stabilize the vibration portion within the cavity of the substrate.

19. The MEMS resonator according to claim 18, further comprising:
a resonator cap having a concave cavity and disposed on the frame to hermetically seal the vibration portion within concave cavity with the frame surrounding the vibration portion; and
a pair of electrical feedthroughs extending through the resonator cap and connected to a pair of electrical contacts disposed on the pair of anchors, respectively,
wherein the pair of support posts are respectively aligned with the pair of electrical feedthroughs in a plan view of the MEMS resonator.

20. The MEMS resonator according to claim 16, further comprising:
a pair of frame connecting beams physically and electrically connecting the pair of anchors to a side of the frame,
wherein the pair of frame connecting beams are respectively disposed between the at least one inner vibrating beam and the pair of outer vibrating beams and extend in a direction parallel thereto.

\* \* \* \* \*